(12) United States Patent
Kakumu et al.

(10) Patent No.: US 12,125,520 B2
(45) Date of Patent: Oct. 22, 2024

(54) SEMICONDUCTOR MEMORY DEVICE

(71) Applicant: Unisantis Electronics Singapore Pte. Ltd., Singapore (SG)

(72) Inventors: Masakazu Kakumu, Tokyo (JP); Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 100 days.

(21) Appl. No.: 18/194,960

(22) Filed: Apr. 3, 2023

(65) Prior Publication Data
US 2023/0317142 A1    Oct. 5, 2023

(30) Foreign Application Priority Data
Apr. 4, 2022    (WO) ............... PCT/JP2022/017049

(51) Int. Cl.
*G11C 11/40*      (2006.01)
*G11C 11/409*     (2006.01)
*H10B 12/00*      (2023.01)

(52) U.S. Cl.
CPC ............ *G11C 11/409* (2013.01); *H10B 12/20* (2023.02)

(58) Field of Classification Search
None
See application file for complete search history.

(56) References Cited

U.S. PATENT DOCUMENTS

| | | |
|---|---|---|
| 2003/0111681 A1 | 6/2003 | Kawanaka |
| 2006/0157738 A1 | 7/2006 | Kawanaka |
| 2008/0137394 A1 | 6/2008 | Shimano et al. |
| 2009/0251959 A1 | 10/2009 | Fukuda |

(Continued)

FOREIGN PATENT DOCUMENTS

| | | |
|---|---|---|
| JP | 2003-188279 A | 7/2003 |
| JP | 2008-147514 A | 6/2008 |

(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: "Impact of Surrounding Gate Transistor (SGT) for Ultra-High-Density LSI's", IEEE Transaction on Electron Devices, vol. 38, No. 3, pp. 573-578 (Mar. 1991).

(Continued)

*Primary Examiner* — Tan T. Nguyen
(74) *Attorney, Agent, or Firm* — Crowell & Moring LLP

(57) ABSTRACT

A p layer is a semiconductor base material. An n+ layer is disposed on one extension side. An n+ layer is disposed on the opposite side in contact with the p layer. A gate insulating layer partially covers the p layer. A first gate conductor layer contacts the insulating layer. A second gate conductor layer is electrically separated from the first gate conductor layer. Memory operation is performed by applying voltage to each of the layers. In the operation, the quotient of the impurity concentration of a region and the gate capacitance of a MOS structure constituted by the layers per unit area is larger than the quotient of the impurity concentration of a region and the gate capacitance of a MOS structure constituted by the layers per unit area.

12 Claims, 10 Drawing Sheets

(56) References Cited

U.S. PATENT DOCUMENTS

| | | | |
|---|---|---|---|
| 2020/0135863 A1 | 4/2020 | Han et al. | |
| 2023/0298659 A1* | 9/2023 | Kakumu | G11C 11/409 |
| | | | 365/189.011 |
| 2023/0309287 A1* | 9/2023 | Kakumu | H10B 12/20 |

FOREIGN PATENT DOCUMENTS

| | | |
|---|---|---|
| JP | 2009-252264 A | 10/2009 |
| TW | 201703157 A | 1/2017 |

OTHER PUBLICATIONS

H. Chung, H. Kim, H. Kim, K. Kim, S. Kim, K. W.Song, J. Kim, Y.C. Oh, Y. Hwang, H. Hong, G. Jin, and C. Chung: "Novel 4F2 DRAM Cell with Vertical Pillar Transistor(VPT)," 2011 Proceeding of the European Solid-State Device Research Conference, (2011).

H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, December, pp. 2201-2227 (2010).

K. Tsunoda, K .Kinoshita, H. Noshiro, Y. Yamazaki, T. Iizuka, Y. Ito, A. Takahashi, A. Okano, Y. Sato, T. Fukano, M. Aoki, and Y. Sugiyama : "Low Power and high Speed Switching of Ti-doped NiO ReRAM under the Unipolar Voltage Source of less than 3V," IEDM (2007), pp. 767-770.

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, vol. 62, No. 6, pp. 1-9 (Jun. 2015).

M. G. Ertosun, K. Lim, C. Park, J. Oh, P. Kirsch, and K. C. Saraswat : "Novel Capacitorless Single-Transistor Charge-Trap DRAM (1T CT DRAM) Utilizing Electron," IEEE Electron Device Letter, vol. 31, No. 5, pp. 405-407 (May 2010).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.

F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI," IEICE Trans. Electron., vol. E90-c., No. 4 pp. 765-771 (2007).

Md. Hasan Raza Ansari, Nupur Navlakha, Jae Yoon Lee, Seongjae Cho, "Double-Gate Junctionless 1T DRAM With Physical Barriers for Retention Improvement", IEEE Trans, on Electron Devices vol. 67, No. 4, pp. 1471-1479 (Apr. 2020).

Takashi Ohasawa and Takeshi Hamamoto, "Floating Body Cell—a Novel Body Capacitorless DRAM Cell", Pan Stanford Publishing (2011).

IPER in Application No. PCT/JP2022/017049, dated Nov. 1, 2022 (IPER.pdf).

\* cited by examiner

| | WL-FET | | PL-FET | | | | | |
|---|---|---|---|---|---|---|---|---|
| Lpoly (nm) | 50nm | | 50nm | | | | | |
| tox(nm) | 5nm | | 5nm | | 5nm | | 5nm | |
| NA(cm-3) | 6.00E+17 | | 6.00E+17 | | 1.00E+18 | | 3.00E+18 | |
| Vth (V) | Erasing | Writing | Erasing | Writing | Erasing | Writing | Erasing | Writing |
| | 0.27 | 0.07 | 0.27 | 0.07 | 0.45 | 0.19 | 1.04 | 0.61 |
| ΔVth | 0.2 | | 0.2 | | 0.26 | | 0.43 | |

| | PL-FET |
|---|---|
| Lpoly (nm) | 50nm |
| tox (nm) | 10nm |
| NA (cm-3) | 1.00E+18 |
| Vth (V) | Erasing / Writing |
| | 0.99 / 0.47 |
| ΔVth | 0.52 |

SEMICONDUCTOR MEMORY DEVICE

CROSS REFERENCE TO RELATED APPLICATIONS

This application claims priority to PCT/JP2022/017049, filed on Apr. 4, 2022, the entire content of which is incorporated herein by reference.

BACKGROUND OF THE INVENTION

Field of the Invention

The present invention relates to a semiconductor memory device.

Description of the Related Art

High integration, high performance, low electric power consumption, and high functionality of a memory element have been requested in recent development of large scale integration (LSI) technologies.

In a normal planar MOS transistor, a channel extends in a horizontal direction along the upper surface of a semiconductor substrate. However, a channel of an SGT extends in a direction orthogonal to the upper surface of a semiconductor substrate (refer to Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991), for example). Thus, densification of a semiconductor device is possible with the SGT unlike with the planar MOS transistor. The SGT can be used as a selection transistor to achieve high integration of a dynamic random access memory (DRAM; refer to H. Chung, H. Kim, H. Kim, K. Kim, S. Kim, K. W. Song, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011), for example) connected to a capacitor, a phase change memory (PCM; refer to H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No 12, December, pp. 2201-2227 (2010), for example) connected to a resistance change element, a resistive random access memory (RRAM4; refer to K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3 V", IEDM (2007), for example), a magnetoresistive random access memory (MRAM; refer to W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015), for example) that changes resistance by changing the orientation of magnetic spin by current, and the like. In addition, there are, for example, a DRAM memory cell (refer to M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010) and Takashi Ohasawa and Takeshi Hamamoto, "Floating Body Cell—a Novel Body Capacitorless DRAM Cell", Pan Stanford Publishing (2011), for example) including no capacitor and constituted by one MOS transistor, a DRAM memory cell (refer to Md. Hasan Raza Ansari, Nupur Navlakha, Jae Yoon Lee, Seongjae Cho, "Double-Gate Junctionless 1T DRAM With Physical Barriers for Retention Improvement", IEEE Trans, on Electron Devices vol. 67, pp. 1471-1479 (2020), for example) including a groove portion in which carriers are accumulated and two gate electrodes. However, a DRAM including no capacitor has such a problem that a sufficient voltage margin cannot be obtained due to high dependency on coupling of a gate electrode from a word line of a floating body. Furthermore, when a substrate is completely depleted, adverse influence thereof is large. In addition, there is a twin-transistor memory element in which one memory cell is formed on a silicon-on-insulator (SOI) layer by using two MOS transistors (refer to US2008/0137394 A1 and US2003/0111681 A1, for example). In such an element, an n+ layer that functions as a source or a drain and divides floating body channels of the two MOS transistors is formed in contact with an insulating layer. Since the n+ layer is in contact with the insulating layer, the floating body channels of the two MOS transistors are electrically separated. Holes as signal electric charge are accumulated in the floating body channel of one of the transistors. The voltage of the floating body channel in which holes are accumulated largely changes with pulse voltage application to the gate electrode of the adjacent MOS transistor. Accordingly, the operation margin between "1" and "0" at writing cannot be set to be sufficiently large (refer to F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI", IEICE Trans. Electron., Vol. E90-c., No. 4 pp. 765-771 (2007), for example). The present application relates to a memory device using a semiconductor element and only including an MOS transistor without a resistance change element or a capacitor.

SUMMARY OF THE INVENTION

The present application provides a semiconductor memory device of a single-transistor DRAM including no capacitor, the semiconductor memory device being capable of solving problems such as noise due to coupling capacitance between a word line and a body and false reading and false rewriting of storage data due to memory instability and achieving a highly-dense and high-speed MOS circuit.

To solve the above-described problem, a memory device including a semiconductor element according to the present invention includes:
- a semiconductor base material extending in a direction horizontal to a substrate or standing in a direction vertical to the substrate;
- a first impurity region connected to one end of the semiconductor base material;
- a second impurity region connected to another end of the semiconductor base material on a side opposite to the first impurity region;
- a first gate insulating layer partially covering the semiconductor base material;
- a first gate conductor layer covering the first gate insulating layer;
- a second gate insulating layer partially covering the semiconductor base material; and
- a second gate conductor layer covering the second gate insulating layer without contacting the first gate conductor layer, in which the semiconductor base material has a first region near the first gate conductor layer and has a second region near the second gate conductor layer, and a value of a fraction the numerator of which is average majority-carrier concentration of the second region of the semiconductor base material and a denominator of which is a value obtained by dividing a capacitance of a MOS gate structure constituted by the second gate conductor layer, the second gate insulating layer, and the semiconductor base material by an area of contact between the second gate conductor layer and the second gate insulating layer is different from a value of a fraction a numerator of which is average majority-carrier concentration of the first region of the semiconductor base material and a denominator of which is a value obtained by dividing a capacitance of a MOS gate structure constituted by the first gate conductor layer, the first gate insulating layer, and the semiconductor base material by an area of contact between the first gate conductor layer and the first gate insulating layer (first aspect).

In the above-described first aspect, the majority-carrier concentration of the second region of the semiconductor base material is higher than the majority-carrier concentration of the first region of the semiconductor base material (second aspect).

In the above-described first aspect, the value of a fraction the numerator of which is the majority-carrier concentration of the second region and the denominator of which is a value obtained by dividing the capacitance of the MOS gate structure constituted by the second gate conductor layer, the second gate insulating layer, and the semiconductor base material by the area of contact between the second gate conductor layer and the second gate insulating layer is larger than the value of a fraction the numerator of which is the majority-carrier concentration of the first region and the denominator of which is a value obtained by dividing the capacitance of the MOS gate structure constituted by the first gate conductor layer, the first gate insulating layer, and the semiconductor base material by the area of contact between the first gate conductor layer and the first gate insulating layer (third aspect).

In the above-described first aspect, a total capacitance of the gate structure constituted by the second gate conductor layer, the second gate insulating layer, and the semiconductor base material is larger than a total capacitance of the gate structure constituted by the first gate conductor layer, the first gate insulating layer, and the semiconductor base material (fourth aspect).

In the above-described first aspect, a thickness of the second gate insulating layer is larger than a thickness of the first gate insulating layer (fifth aspect).

In the above-described first aspect, dependency of a threshold value of a MOS transistor region including the second gate insulating layer on majority-carrier concentration of the semiconductor base material is larger than dependency of a threshold value of a MOS transistor region including the first gate insulating layer on the majority-carrier concentration of the semiconductor base material (sixth aspect).

In the above-described first aspect, voltage applied to a plate line connected to the second gate conductor layer when memory information is to be read is between a threshold value of a MOS transistor including the second gate conductor layer at memory writing and a threshold value of the MOS transistor at memory erasing (seventh aspect).

In the above-described first aspect, variation of the threshold value of a MOS transistor region including the second gate insulating layer between memory written and erased states is larger than variation of the threshold value of a MOS transistor region including the first gate insulating layer between memory written and erased states (eighth aspect).

In the above-described first aspect, an absolute value of the threshold value of a MOS transistor including the second gate insulating layer close to a bit line is constantly larger than an absolute value of the threshold value of a MOS transistor including the first gate insulating layer close to a source line (ninth aspect).

In the above-described first aspect, memory write operation is executed by controlling voltage applied to each of the first impurity region, the second impurity region, the first gate conductor layer, and the second gate conductor layer to perform operation of generating electrons and holes in the semiconductor base material and the first impurity region through an impact ionization phenomenon with current flowing between the first impurity region and the second impurity region or through gate induced drain leakage current, and perform operation of retaining, in the semiconductor base material, some or all of either the generated electrons or holes that are majority carriers in the semiconductor base material, and memory erase operation is executed by controlling voltage applied to each of the first impurity region, the second impurity region, the first gate conductor layer, and the second gate conductor layer to remove either the retained electrons or holes that are majority carriers in the first semiconductor layer from at least one of the first impurity region and the second impurity region (tenth aspect).

In the above-described tenth aspect, the first impurity region is connected to a source line, the second impurity region is connected to a bit line, the first gate conductor layer is connected to a word line, the second gate conductor layer is connected to a plate line, and memory writing and erasure are performed by applying voltage to each of the source line, the bit line, the plate line, and the word line (eleventh aspect).

In the above-described tenth aspect, the first impurity region is connected to the bit line, the second impurity region is connected to the source line, and memory writing and erasure are performed by applying voltage to each of the source line, the bit line, the plate line, and the word line (twelfth aspect)

DETAILED DESCRIPTION OF THE PREFERRED EMBODIMENTS

The structure of a memory device including a semiconductor element, a drive method, accumulated carrier behavior, cell disposition of the semiconductor device, and a wiring structure according to the present invention will be described below with reference to the accompanying drawings.

First Embodiment

The structure and operation mechanism of a memory cell including a semiconductor element according to a first embodiment of the present invention will be described below with reference to FIGS. 1A to 4B. The cell structure of a memory including a semiconductor element according to the present embodiment will be described below with reference to FIGS. 1A, 1B, 1C, and 1D. An additional example of the cell structure of the memory including a semiconductor element according to the present embodiment will be described below with reference to FIGS. 2A, 2B, 2C, and 2D. The writing mechanism and carrier behavior of the memory including a semiconductor element will be described below with reference to FIGS. 3A, 3B, and 3C, and the data erasing mechanism thereof will be described below with reference to FIGS. 4A and 4B. Change of a threshold value of a MOS transistor region in a memory cell of a semiconductor device according to the present embodiment will be described below with reference to tables in FIGS. 5A, 5B, and 5C.

Figure 1A:
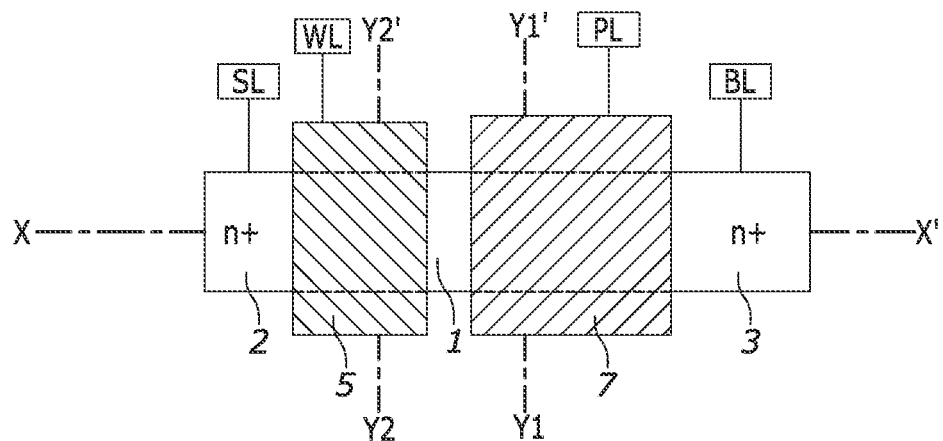
FIGS. 1A, 1B, 1C, and 1D are diagrams illustrating sectional structures of a memory device including semiconductor elements according to a first embodiment.
Figure 1B:
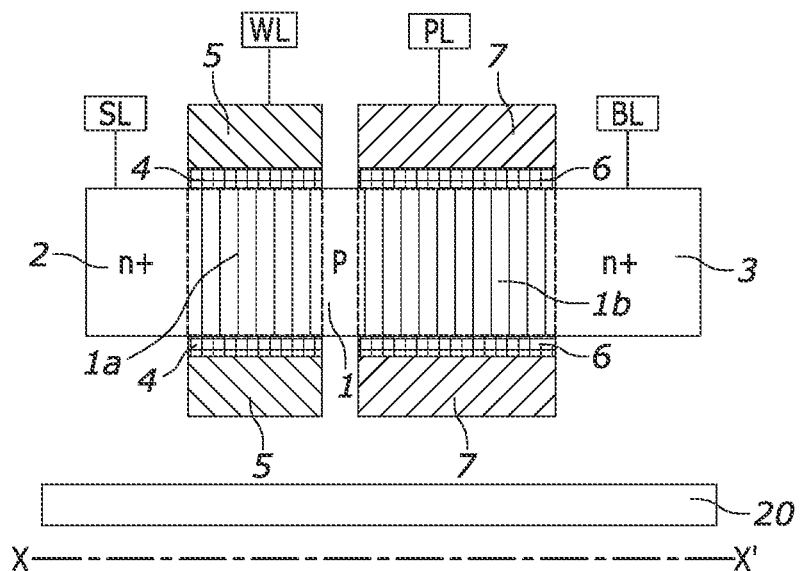
Figure 1C:
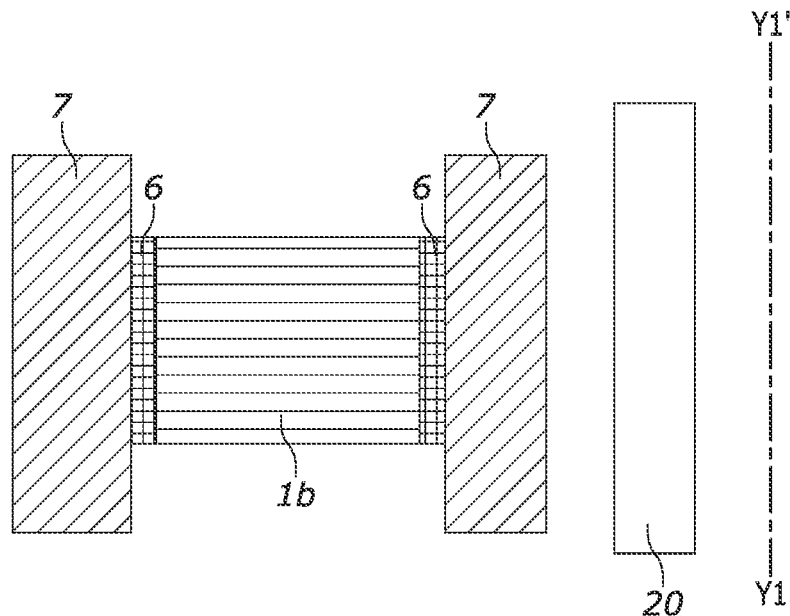
Figure 1D:
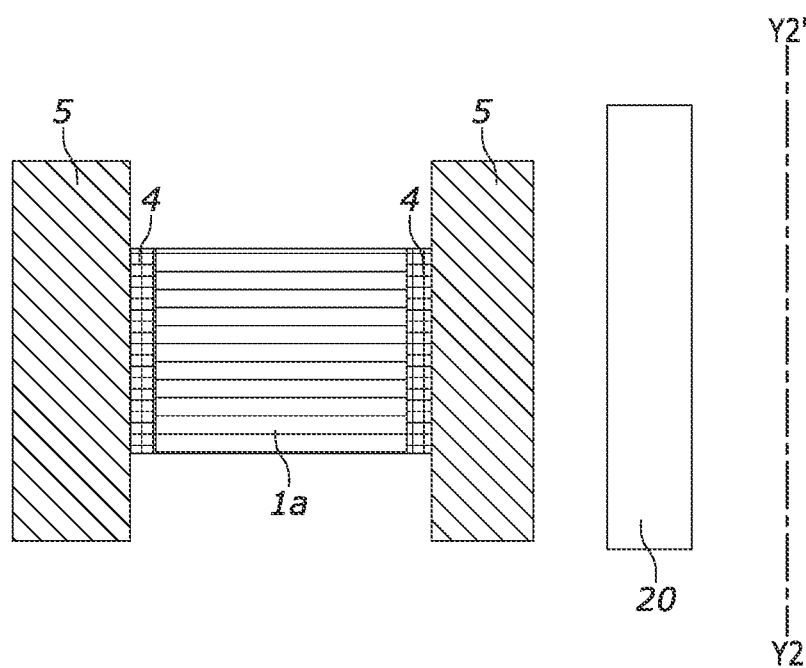

FIGS. 1A, 1B, 1C, and 1D illustrate the structure of the memory including a semiconductor element according to the first embodiment of the present invention. FIG. 1A illustrates a plan view, FIG. 1B illustrates a cross-sectional view along line X-X' in FIG. 1A, and FIG. 1C illustrates a cross-sectional view along line Y-Y' in FIG. 1A.

A p layer 1 (example of a "semiconductor base material" in the claims) is disposed above a substrate 20 (example of a "substrate" in the claims), the p layer 1 extending in a direction horizontal to the substrate 20, being a silicon semiconductor base material containing acceptor impurities, having a p-type or i-type (intrinsic type) conduction type, and having a rectangular section orthogonal to a central axis. An n+ layer 2 (hereinafter, a semiconductor region containing donor impurities at high concentration is referred to as an "n+ layer") (example of a "first impurity region" in the claims) is disposed on one side of the p layer 1 in the horizontal direction. An n+ layer 3 (example of a "second impurity region" in the claims) is disposed on a side opposite to the n+ layer 2. A gate insulating layer 4 (example of a "first gate insulating layer" in the claims) is disposed on part of the surface of the p layer 1 and in contact with or in proximity to the n+ layer 2. A first gate conductor layer 5 (example of a "first gate conductor layer" in the claims) is disposed around part of the gate insulating layer 4 and in proximity to the n+ layer 2. A gate insulating layer 6 (example of a "second gate insulating layer" in the claims) is disposed on part of the surface of the p layer 1 and in contact with or in proximity to the n+ layer 3. A gate conductor layer 7 (example of a "second gate conductor layer" in the claims) is disposed in contact with the gate insulating layer 6 and in proximity to the n+ layer 3 without contacting the gate conductor layer 5. One dynamic flash memory cell is formed by the p layer 1, the n+ layer 2, the n+ layer 3, the gate insulating layer 4, the gate conductor layer 5, the gate insulating layer 6, and the gate conductor layer 7. The p layer 1 has a region 1a thereinside (example of a "first region of the semiconductor base material" in the claims) immediately adjacent to the gate conductor layer 5 and has a region 1b (example of a "second region of the semiconductor base material" in the claims) immediately adjacent to the gate conductor layer 7. The value of a fraction the numerator of which is the acceptor concentration of the region 1b and the denominator of which is a value obtained by dividing the capacitance of a MOS gate with the gate conductor layer 7 as a gate electrode by the area of contact between the gate conductor layer 7 and the gate insulating layer 6 (hereinafter, a value obtained by dividing MOS gate capacitance by the area of contact between a gate electrode and a gate insulating layer as constituent components is referred to as "capacitance per unit area") in a MOS gate structure constituted by the gate conductor layer 7, the gate insulating layer 6, and the p layer 1 is larger than the value of a fraction the numerator of which is the acceptor concentration of the region 1a and the denominator of which is the capacitance of a MOS gate structure constituted by the gate conductor layer 5, the gate insulating layer 4, and the p layer 1 per unit area.

The n+ layer 2 is connected to a source line SL (example of a "source line" in the claims) as a wiring electric conductor, the gate conductor layer 5 is connected to a word line WL (example of a "word line" in the claims) as a wiring electric conductor, and the gate conductor layer 7 is connected to a plate line PL (example of a "plate line" in the claims) as a wiring electric conductor. The n+ layer 3 is connected to a bit line BL (example of a "bit line" in the claims) as a wiring electric conductor. Memory operation is performed by manipulating the potential of each of the source line, the bit line, the plate line, and the word line. In the memory device of the present embodiment, a plurality of above-described dynamic flash memory cells are two-dimensionally or three-dimensionally arranged. Hereinafter, this memory device is referred to as a dynamic flash memory.

It is well known that the threshold value (hereinafter referred to as Vth) of an n-type channel MOS transistor and change (hereinafter referred to as $\Delta$Vth-BG) of the threshold value due to substrate bias have a positive correlation (in a p-type channel case, a negative correlation) with the value of $(NA)^{0.5}/Cox$, where Cox represents the gate capacitance per unit area and NA represents the acceptor concentration of the substrate (majority-carrier concentration of the substrate) below a gate oxide film per unit volume. In other words, the change $\Delta$Vth-BG due to substrate bias is larger as NA is larger and Cox is smaller.

Thus, Vth and $\Delta$Vth-BG of a MOS transistor region including the gate conductor layer 7 can be set to be larger than those of a MOS transistor region including the gate conductor layer 5 when a value obtained by dividing the concentration of acceptors that are majority carriers in the region 1b of the p layer 1 surrounded by the gate conductor layer 7 by the capacitance of the MOS gate structure constituted by the gate conductor layer 7, the gate insulating layer 6, and the p layer 1 per unit area can be set to be larger than a value obtained by dividing the acceptor concentration of the region 1a surrounded by the gate conductor layer 5 by the capacitance of the MOS gate structure constituted by the gate conductor layer 5, the gate insulating layer 4, and the p layer 1 per unit area.

There are available a large number of specific methods of achieving the above-described setting. The specific methods include setting the acceptor concentration of the region 1b to be higher than that of the region 1a, setting the thickness of the second insulating layer to be larger than the thickness of the first gate insulating layer, and setting the dielectric constant of the first gate insulating layer to be larger the dielectric constant of the second gate insulating layer. At least one of the specific methods may be selected or a plurality thereof may be combined.

Any insulating film used in a normal MOS process, such as a SiO2 film, a SiON film, a HfSiON film, or a SiO2/SiN multilayer film may be used as the gate insulating layers 4 and 6.

The p layer 1 including the regions 1a and 1b is a p-type semiconductor in FIGS. 1A, 1B, 1C, and 1D but may have a profile for impurity concentration. In addition, profiles may be provided for impurity concentration of the n+ layer 2 and the n+ layer 3.

When the n+ layers 2 and 3 are each formed as a p+ layer (hereinafter, a semiconductor region containing acceptor impurities at high concentration is referred to as a "p+ layer") in which majority carriers are holes, operation of a dynamic flash memory is performed with electrons as writing carriers by employing an n-type semiconductor as the p layer 1.

The gate conductor layers 5 and 7 may be formed a metal or metal nitride such as W, Pd, Ru, Al, TiN, TaN, or WN, an alloy thereof (including silicide), or a laminated structure such as TiN/W/TaN or of a semiconductor doped at high concentration as long as the layers can change the potential of part of the corresponding memory cell through the gate insulating layer 4 and the gate insulating layer 6, respectively.

Although FIGS. 1A, 1B, 1C, and 1D illustrate an example in which the p layer 1 extends in the direction horizontal to the substrate 20, the p layer 1 may extend in a direction vertical to the substrate 20.

The gate conductor layers 5 and 7 in each memory cell are each a single layer in FIGS. 1A, 1B, 1C, and 1D but may be divided in the direction horizontal or vertical to the semiconductor base material.

Although FIGS. 1A, 1B, 1C, and 1D illustrate an example in which the gate conductor layers 5 and 7 are disposed on both sides of the semiconductor base material 1, a gate conductor layer may be disposed on any one of the sides.

Figure 2A:
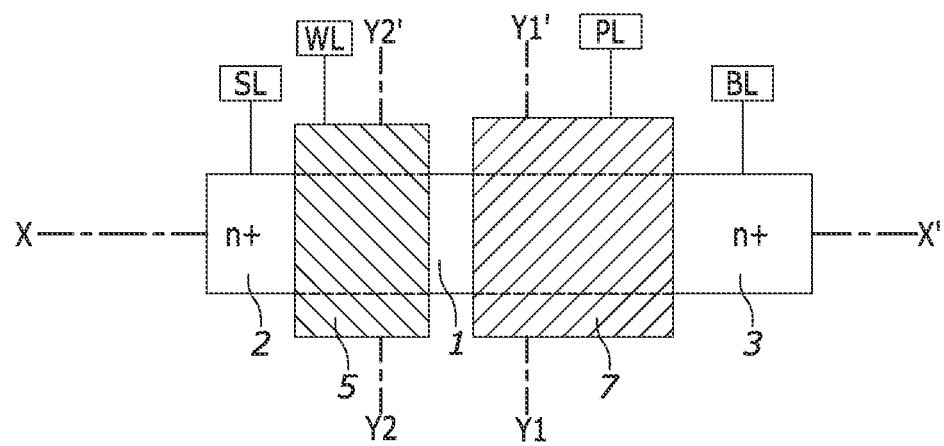
FIGS. 2A, 2B, 2C, and 2D are diagrams illustrating additional examples of sectional structures of the memory device including semiconductor elements according to the first embodiment.
Figure 2B:
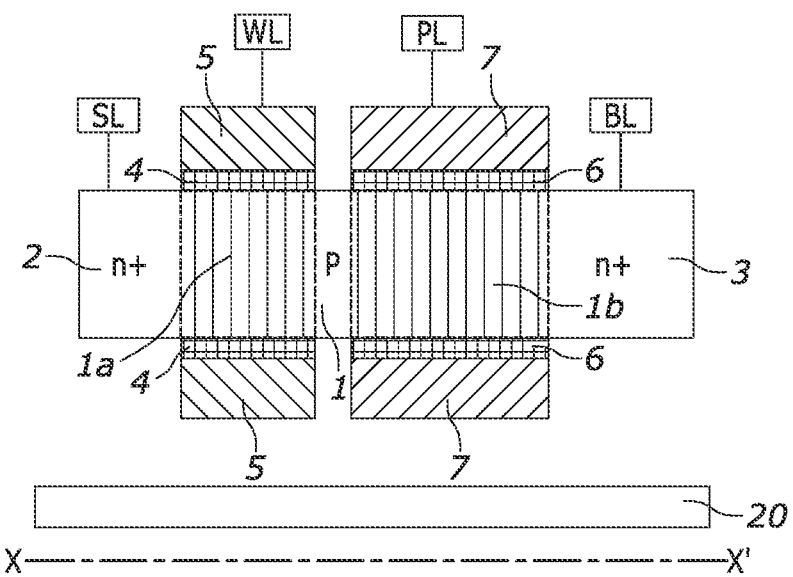
Figure 2C:
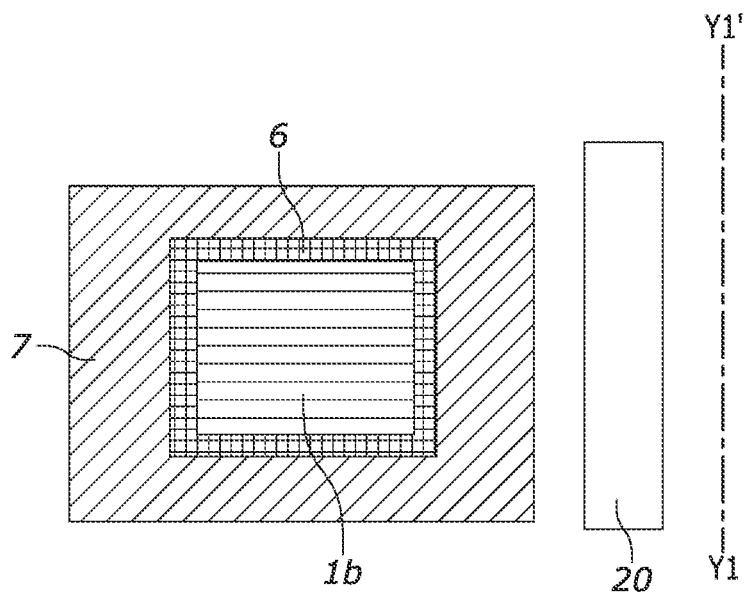
Figure 2D:
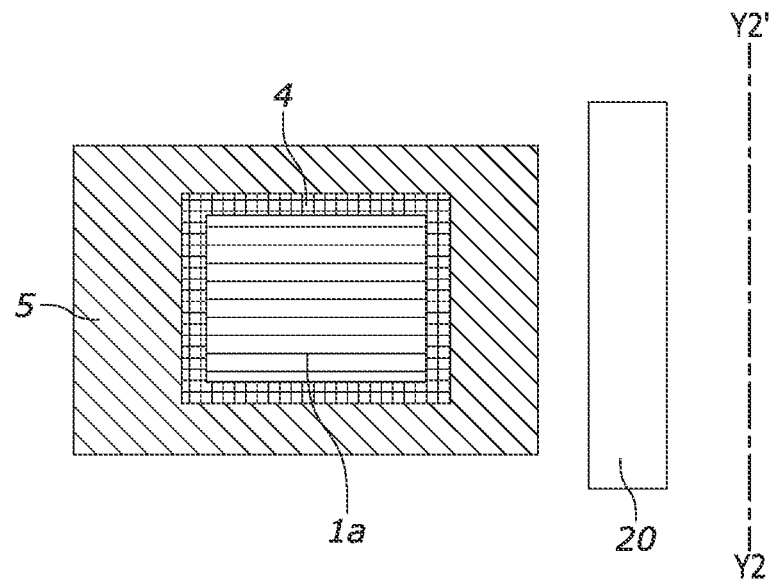

An additional example of the dynamic flash memory device according to the first embodiment of the present invention will be described below with reference to FIGS. 2A, 2B, 2C, and 2D. FIGS. 2A, 2B, 2C, and 2D illustrate the structure of the memory including a semiconductor element according to the first embodiment of the present invention. FIG. 2A is a plan view, FIG. 2B is a cross-sectional view along line X-X', FIG. 2C is a cross-sectional view along line Y1-Y1', and FIG. 2D is a cross-sectional view along line Y2-Y2'. The memory cell has a structure in which the gate conductor layers 5 and 7 are disposed on both sides of the semiconductor base material 1 in FIGS. 1A, 1B, 1C, and 1D, but the gate conductor layers 5 and 7 may cover a periphery of the semiconductor base material 1 as illustrated in FIGS. 2A, 2B, 2C, and 2D. In this case as well, the value obtained by dividing the acceptor concentration of the region 1b by the gate capacitance of the MOS gate structure constituted by the gate conductor layer 7, the gate insulating layer 6, and the p layer 1 per unit area is larger than the value obtained by dividing the acceptor concentration of the region 1a by the capacitance of the MOS gate structure constituted by the gate conductor layer 5, the gate insulating layer 4, and the p layer 1 per unit area.

Although the semiconductor base material 1 has a rectangular section in the vertical direction in FIGS. 1A, 1B, 1C, and 1D, and 2A, 2B, 2C, and 2D, the section may have a trapezoid shape, a polygonal shape, or a circular shape as long as, the value obtained by dividing the acceptor concentration of the substrate in the MOS gate structure including the gate conductor layer 7 as an electrode by the capacitance thereof per unit area is larger than that of the MOS gate structure including the gate conductor layer 5.

Figure 3A:
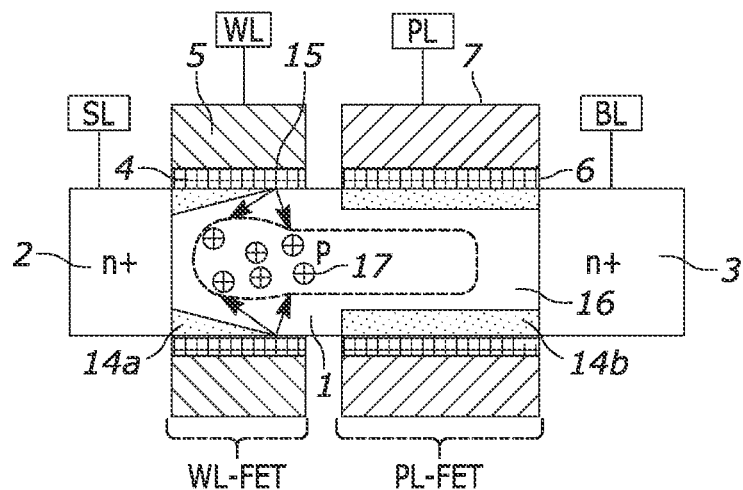
FIGS. 3A, 3B, and 3C are diagrams for description of accumulation of hole carriers right after write operation, erase operation, and cell current in the memory device including a semiconductor element according to the first embodiment.

Carrier behavior, accumulation, and cell current at write operation in the dynamic flash memory according to the first embodiment of the present invention will be described below with reference to FIGS. 3A, 3B, and 3C. The MOS transistor region including the gate conductor layer 5 is denoted by WL-FET (field-effect MOS transistor connected to the word line WL), and the MOS transistor region including the gate conductor layer 7 is denoted by PL-FET (field-effect MOS transistor connected to the plate line PL). Description is first made on a case in which majority carriers in the n+ layers 2 and 3 are electrons, for example, n+ poly (hereinafter, poly Si containing donor impurities at high concentration is referred to as "n+ poly") is used for the gate conductor layer 5 connected to the word line WL and the gate conductor layer 7 connected to the plate line PL, and a p-type semiconductor is used as the p layer 1 as illustrated in FIG. 3A. For example, 0 V is input to the n+ layer 2 connected to the source line SL, for example, 2.5 V is input to the n+ layer 3 connected to the bit line BL, for example, 4 V is input to the gate conductor layer 7 connected to the plate line PL, and for example, 1.5 V is input to the gate conductor layer 6a connected to the word line WL.

In this voltage applied state, an inversion layer 14b is formed entirely on the inner side of the gate insulating layer 6 contacting the gate conductor layer 7 above and below in the example illustrated in FIGS. 1A, 1B, 1C, and 1D and entirely on the inner periphery of the gate insulating layer 6 contacting the gate conductor layer 7 in the example illustrated in FIGS. 2A, 2B, 2C, and 2D. In addition, an inversion layer 14a is formed on part of the inner side of the gate insulating layer 4 above and below in the example illustrated in FIGS. 1A, 1B, 1C, and 1D and is formed on part of the inner periphery of the gate insulating layer 4 in the example illustrated in FIGS. 2A, 2B, 2C, and 2D. As illustrated in FIG. 3A, there is a pinch-off point 15 at which the inversion layer 14a is annihilated and at which electric field is maximum. Then, electrons flow from the n+ layer 2 toward the n+ layer 3. As a result, an impact ionization phenomenon occurs in the vicinity of the pinch-off point 15. Due to the impact ionization phenomenon, electrons accelerated from the n+ layer 2 connected to the source line SL toward the n+ layer 3 connected to the bit line BL collide with a Si lattice, and electron-hole pairs are generated by kinetic energy of the electrons. Some of the generated electrons flow to the gate conductor layer 5, but most of them flow to the n+ layer 3 connected to the bit line BL.

Figure 3B:
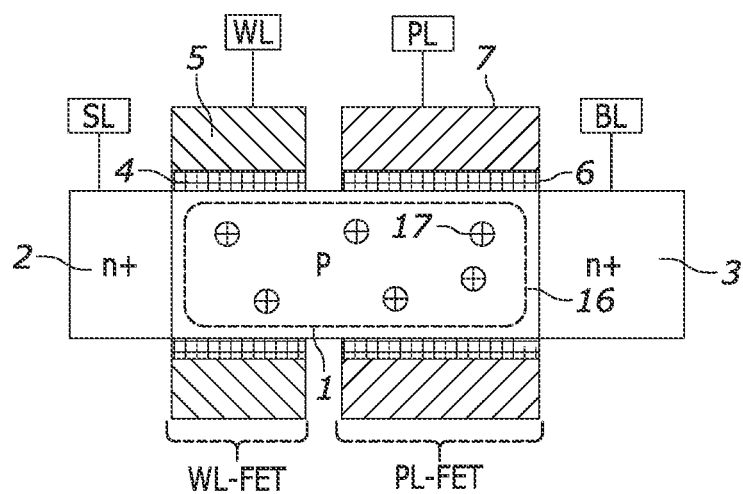
Figure 3C:
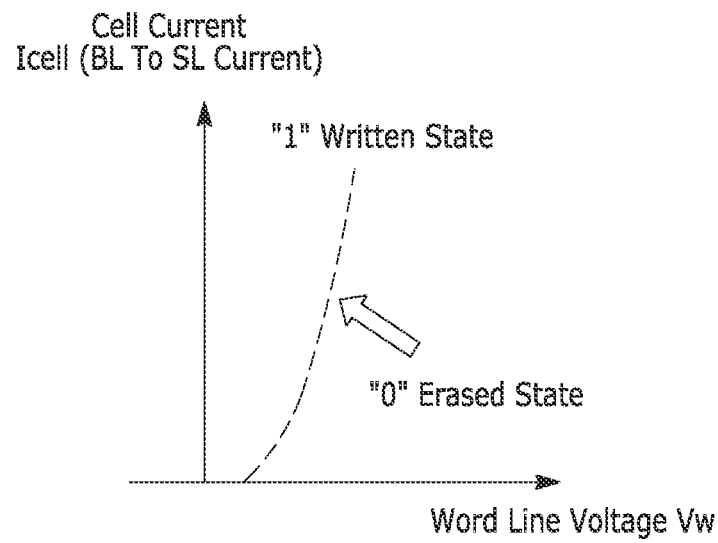

FIG. 3B illustrates holes 17 in the p layer 1 when all biases are 0 V right after writing. The generated holes 17 as majority carriers in the p layer 1 are temporarily accumulated in the p layer 1 surrounded by a depleted layer 16 and charge, to positive bias, the p layer 1 as the substrate of the WL-FET and the PL-FET in effect in a non-equilibrium state. As a result, the threshold voltage of the WL-FET including the gate conductor layer 5 and the threshold voltage of the PL-FET including the gate conductor layer 7 decrease as compared to the initial state by the positive substrate biasing effect due to the holes temporarily accumulated in the p layer 1. When voltage higher than the decreased threshold voltage is applied to PL, the PL-FET becomes conductive and the WL-FET operates as a MOS transistor. Accordingly, in the WL-FET including the gate conductor layer 5 connected to the word line WL, current having WL voltage dependency flows from the n+ layer 3 to the n+ layer 2 as illustrated in FIG. 3C. This written state is allocated as logically stored data "1".

The above-described conditions of voltage applied to the bit line BL, the source line SL, the word line WL, and the plate line PL are examples for performing write operation but may be any other conditions of operation voltage with which write operation can be performed. For example, the above-described conditions of voltage applied to the bit line BL, the source line SL, the word line WL, and the plate line PL may be any combination such as 2.5 V (BL)/0 V (SL)/2 V (PL)/4 V (WL), 2.5 V (BL)/0 V (SL)/4 V (PL)/1 V (WL), or 0 V (BL)/2.5 V (SL)/4 V (PL)/0 V (WL). However, when 2.5 V is applied to the bit line BL, 0 V is applied to the source line SL, 4 V is applied to the word line WL, and 2 V is applied to the plate line PL, the position of the pinch-off point 15 shifts toward the gate conductor layer 7 but still the same phenomenon can be caused. When 2.5 V is applied to the bit line BL, 0 V is applied to the source line SL, 1 V is applied to the word line WL, and 4 V is applied to the plate line PL, the position of the pinch-off point 15 shifts toward the gate conductor layer 5 but still the same phenomenon can be caused. However, it is essential to apply voltage higher than the threshold voltage of the gate conductor layer 7 of the PL-FET to the gate conductor layer 7 before the written state.

Holes may be generated by causing flow of gate induction drain leakage (GIDL) current instead of causing the above-described impact ionization phenomenon (refer to Md. Hasan Raza Ansari, Nupur Navlakha, Jae Yoon Lee, Seongjae Cho, "Double-Gate Junctionless 1T DRAM With Physical Barriers for Retention Improvement", IEEE Trans, on Electron Devices vol. 67, pp. 1471-1479 (2020), for example).

Figure 4A:
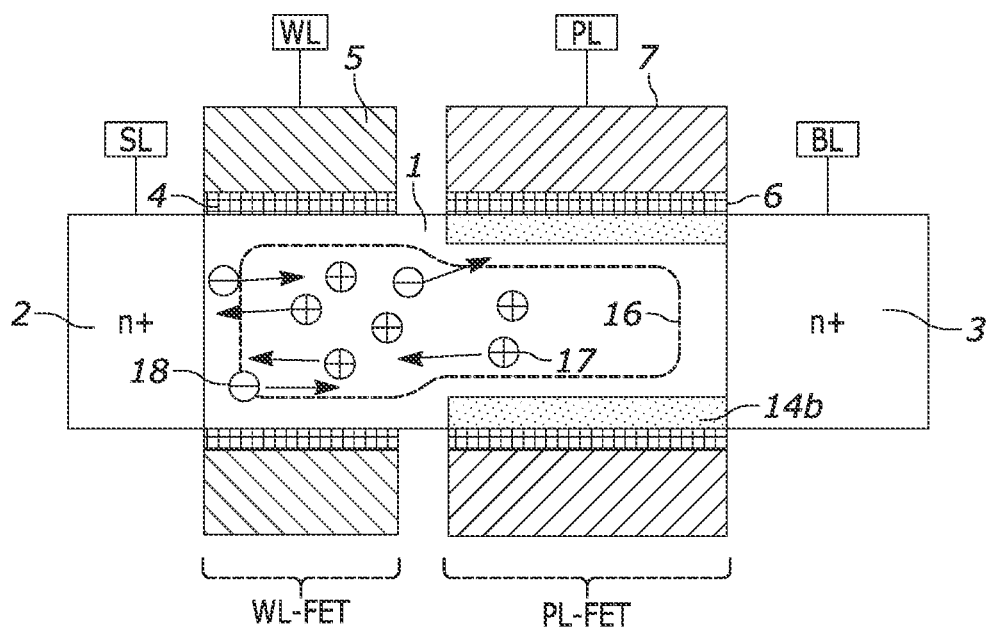
FIGS. 4A and 4B are diagrams for description of cell disposition of the memory device including a semiconductor element according to the first embodiment.
Figure 4B:
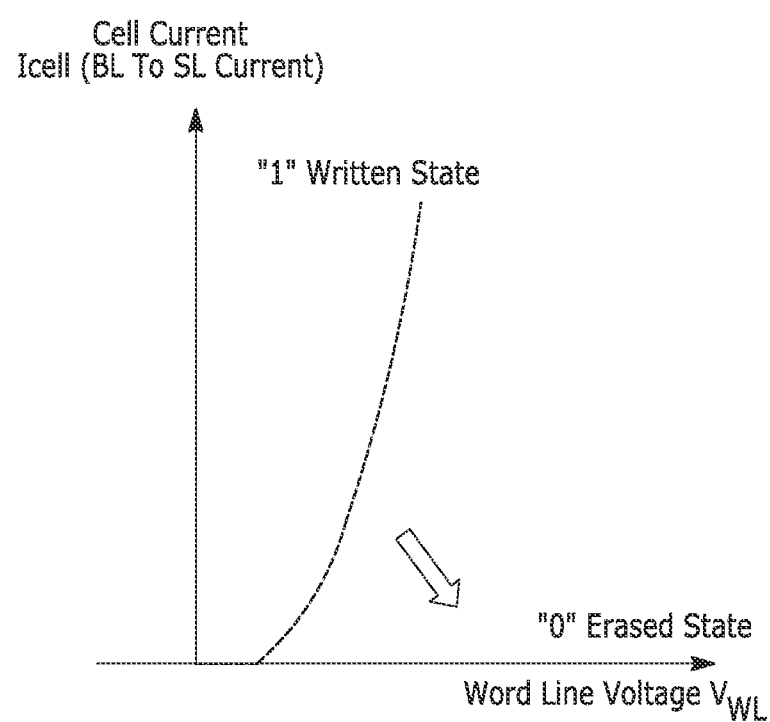

An erase operation mechanism of the dynamic flash memory according to the first embodiment illustrated in FIGS. 1A to 1D and 2A to 2D will be described below with reference to FIGS. 4A and 4B. In the state illustrated in FIG. 3B, 0.6 V is applied to the bit line BL, 0 V is applied to the source line SL, 3 V is applied to the plate line PL, and 0 V is applied to the word line WL. As a result, the concentration of holes 17 accumulated in the p layer 1 is sufficiently higher than the concentration of holes in the n+ layer 2, and accordingly, holes flow into the n+ layer 2 by diffusion due to the gradient of concentration. Conversely, the concentration of electrons in the n+ layer 2 is higher than the concentration of electrons in the p layer 1, and accordingly, electrons 18 flow into the p layer 1 by diffusion due to the gradient of concentration. The electrons having flowed into the p layer 1 are annihilated through recombination with holes in the p layer 1. However, not all injected electrons 18 are annihilated, and electrons 18 not annihilated flow into the n+ layer 3 through the depleted layer 16 by drifting due to the gradient of potential between the bit line BL and the source line SL. Since electrons are sequentially supplied from the source line SL, excessive holes recombine with electrons in an extremely short time and the initial state is reached again. Accordingly, as illustrated in FIG. 4B, the WL-FET including the gate conductor layer 5 connected to the word line WL and the PL-FET including the gate conductor layer 7 return to the original threshold values. This erased state of the storage element is allocated as logically stored data "0".

Voltage applied to the bit line is adjustable to any range higher or lower than 0.6 V as long as electron drift in the depleted layer 16 occurs with the voltage. In another data erasing method, the above-described condition of voltage applied to the bit line BL, the source line SL, the word line WL, and the plate line PL may be a combination such as 0.6 V (BL)/0 V (SL)/0 V (PL)/3 V (WL), 0 V (BL)/0.6 V (SL)/3 V (PL)/0 V (WL), −0.6 V (BL)/0 V (SL)/3 V (PL)/0 V (WL), or 1.5 V (BL)/0 V (SL)/0 V (PL)/3 V (WL), and the above-described condition of voltage applied to the bit line BL, the source line SL, the word line WL, and the plate line PL is an example for performing erase operation and may be any other operation condition that erase operation can be performed.

Note that, at data reading, a characteristic that no current flows when voltage of the word line WL is set to be high at logical storage data "0" reading as illustrated in FIG. 4B is obtained by setting voltage applied to the second gate conductor layer 7 connected to the plate line PL to be higher than a threshold voltage in a case of logical storage data "1" and lower than a threshold voltage in a case of logical storage data "0". With this configuration, the operation margin of the dynamic flash memory is expanded.

The dependency of change in the threshold value of each MOS transistor region included in the dynamic flash memory between writing and erasing on gate capacitance per unit area will be described below with reference to FIGS. 5A, 5B, and 5C.

Figures 5A, 5B:
FIGS. 5A, 5B, and 5C illustrate tables for description of change of threshold values of MOS transistors included in the memory device including a semiconductor element according to the first embodiment when parameters thereof are changed.

FIG. 5A illustrates two kinds of FET, namely a WL-FET and a PL-FET included in the dynamic flash memory. WL represents gate voltage for the WL-FET, and PL represents gate voltage for the PL-FET. The WL-FET is set to have a gate length (hereinafter referred to as Lpoly) of 50 nm, the gate oxide film is set to have a thickness (hereinafter referred to as tox) of 5 nm, and the region 1a is set to uniformly have an acceptor concentration (hereinafter referred to as Na) of $6\times10^{17}$ cm$^{-3}$. A gate length is defined as the length of a gate conductor layer in the direction of X-X' in FIGS. 1A to 1D and 2A to 2D. It is also assumed that the PL-FET is set to have Lpoly of 50 nm and fixed tox of 5 nm, and the region 1b is set to have three Na values of $6\times10^{17}$ cm$^{-3}$, $1\times10^{18}$ cm$^{-3}$, and $3\times10^{18}$ cm$^{-3}$.

FIG. 5B illustrates conditions of MOS transistors and Vth at data writing and erasing with VD=0.05 V as well as threshold value change (hereinafter referred to as ΔVth) between the two states indicated. Note that a short channel effect is considered in calculation of Vth. It can be understood that as the acceptor concentration increases, the value of ΔVth increases, for example, ΔVth of the WL-FET and the PL-FET is 0.2 V for tox=5 nm and Na=$6\times10^{17}$ cm$^{-3}$, ΔVth of the PL-FET is 0.26 V for Na=$1\times10^{18}$ cm$^{-3}$, and ΔVth is 0.43 V for Na=$3\times10^{18}$ cm$^{-3}$. Expansion of ΔVth leads to expansion of the operation margin of the dynamic flash memory.

Figures 5C, 6A:
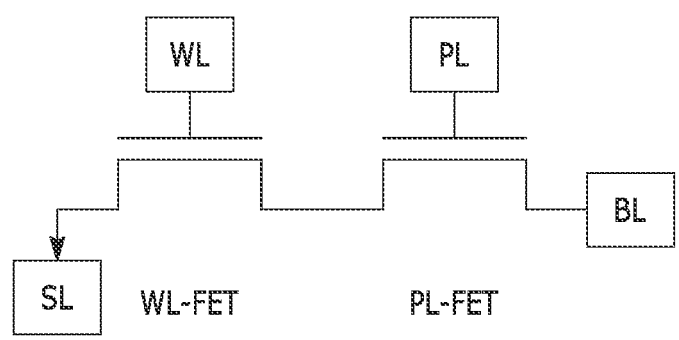
FIGS. 6A, 6B, and 6C are diagrams illustrating the configuration of the memory device including a semiconductor element according to the first embodiment and voltage relations in memory erased and written states.

FIG. 5C indicates Vth and ΔVth when tox is changed from 5 nm to 10 nm with a condition of Na=$1\times10^{18}$ cm$^{-3}$ in the PL-FET in FIG. 4B. It can be understood from this diagram that ΔVth can be further increased by increasing tox, that is, decreasing the gate capacitance. In other words, it can be understood that when the acceptor concentration of the PL-FET is set to be higher than that of the WL-FET or the thickness of the gate insulating layer of the PL-FET is set to be larger than that of the WL-FET to reduce the gate electrode capacitance per unit area, the dependency of the threshold value of each MOS transistor on the majority-carrier concentration of the semiconductor substrate becomes higher and variation of the threshold value becomes more sensitive to the number of surplus holes due to writing and erasure. When the PL-FET and the WL-FET are of the p-type channel type, the p layer 1 is an n-type semiconductor and donor is majority carrier.

Figure 6B:
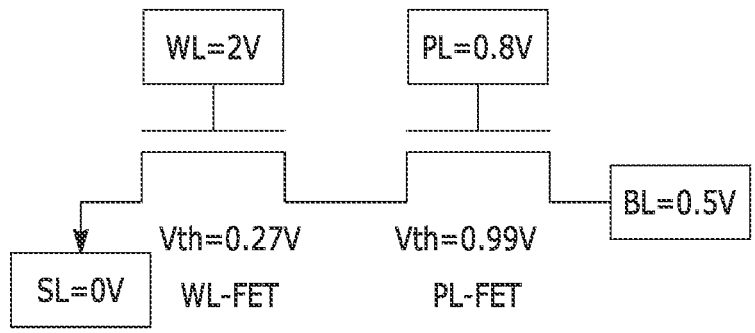

It will be described below with reference to FIGS. 6A, 6B, and 6C that the ΔVth increase described with reference to FIGS. 5A, 5B, and 5C can be usefully exploited to expand the margin of operation of the dynamic flash memory. FIG. 6A illustrates the configuration of the dynamic flash memory in which the PL-FET and the WL-FET in FIG. 5A are connected. In this example, conditions such as tox=5 nm and Na=6×10$^{17}$ cm$^{-3}$ for the WL-FET and tox=10 nm and Na=1×10$^{18}$ cm$^{-3}$ for the PL-FET are set.

First, for reading from the dynamic flash memory, 0.5 V is applied to BL, 0.8 V is applied to PL, 2.0 V is applied to WL, and 0 V is applied to SL. FIG. 6B illustrates a voltage relation in the erased state. As clearly understood from this diagram, the WL-FET is on but the PL-FET is off because the voltage of PL is equal to or lower than the threshold value, and no current flows from BL to SL by increasing the voltage of WL to any extent. Accordingly, no current flows in spite of reading operation, and thus it is recognized that memory information is "0". This indicates that logically stored data "1" and "0" are obtained with a large operation margin illustrated in FIGS. 3C and 4B by setting voltage applied to the second gate conductor layer 7 connected to the plate line PL to be higher than a threshold voltage in a case of logically stored data "1" and lower than a threshold voltage in a case of logically stored data "0".

Figure 6C:
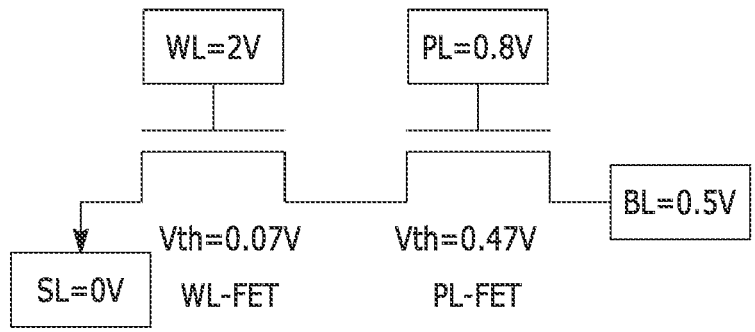

FIG. 6C illustrates a voltage relation in the written state. Memory reading conditions are completely the same as in FIG. 6B. In this case, the gate voltage of each of the WL-FET and the PL-FET becomes equal to or higher than the threshold value, both MOS transistors become on, current flows from BL to SL, and memory information is recognized as "1".

The above-described conditions of voltage applied to the bit line BL, the source line SL, the word line WL, and the plate line PL are examples for performing data reading operation but may be any other conditions of operation voltage with which reading operation can be performed. For example, data can be read in the same manner by applying 1 V to the bit line BL, 0 V to the source line SL, 3 V to the word line WL, and 0.9 V to the plate line PL. However, voltage applied to the plate line PL needs to be between the threshold values of the PL-FET in the data erased and written states.

Although the gate length of the WL-FET is 50 nm and the gate length of the PL-FET is 50 nm in the above-described example, the gate length of the PL-FET may be shorter or longer as long as the margin of ΔVth between writing and erasing is sufficient while the threshold value of the PL-FET is constantly higher than the threshold value of the WL-FET.

The operation voltage margin of the memory can be expanded by changing combination of the acceptor concentration of the p layer 1 and the thickness of each gate insulating layer as described above with reference to FIGS. 4A and 4B.

The gate lengths of the PL-FET and the WL-FET are equal in the example illustrated in FIGS. 5A, 5B, and 5C, and 6A, 6B, and 6C. However, in an exemplary application, the gate length of the plate line may be set to be longer, for example, 200 nm to set the gate capacitance of the plate line to be higher than that of the word line. In this case, variation in the voltage of a floating body of the memory cell in response to voltage change of the word line is reduced, and accordingly, stability of the memory cell increases.

Change of the carrier concentration and the thickness of each insulating layer depending on a condition that the memory is read affects, for example, conditions of voltage applied to the source line, the word line, the plate line, and the bit line for optimization at memory writing and erasing.

Operation of the dynamic flash memory is possible also when the bit line and the source line are interchanged to adjust voltage applied to the plate line and the word line.

The present embodiment has the following characteristics.

(Characteristic 1)

The dynamic flash memory according to the first embodiment of the present invention includes the p layer 1 as the semiconductor base material, the first impurity region 2, the second impurity region 3, the first gate insulating layer 4, the second gate insulating layer 6, the first gate conductor layer 5, and the second gate conductor layer 7. The value obtained by dividing the carrier concentration of the region 1b in the MOS transistor region including the second gate conductor layer 7 as a constituent component of the PL-FET by the capacitance of the MOS gate structure constituted by the second gate conductor layer 7, the second gate insulating layer 6, and the p layer 1 with the second gate conductor layer 7 as a gate electrode, per unit area, is larger than the value obtained by dividing the carrier concentration of the region 1a in the MOS transistor region including the first gate conductor layer 5 as a constituent component of the WL-FET by the capacitance of the MOS gate structure constituted by the first gate conductor layer, the first gate insulating layer, and the p layer 1 per unit area. Accordingly, the substrate-carrier dependency of the threshold value of the PL-FET and the substrate biasing effect can be increased so that the difference in the threshold voltage of the PL-FET between data writing and erasing can be increased to expand the operation margin of the memory.

(Characteristic 2)

In the dynamic flash memory according to the first embodiment of the present invention, it is extremely important that the PL-FET functions as a gate to determine whether the potential of the bit line BL is transferred to the memory cell. At memory reading, it is important to cut off the potential of the bit line BL when memory written information is "0" and to immediately transfer the voltage of the bit line to the memory cell when memory written information is "1", and thus threshold voltage change between "0" and "1" needs to be large. It is important for the WL-FET to cause larger cell current to flow to the bit line BL when the PL-FET is on. Thus, it is required that the threshold value is low as possible and larger current flows once the WL-FET is turned on. With the dynamic flash memory, the dependency of each of the PL-FET and the WL-FET on the majority-carrier concentration of the semiconductor base material can be independently set in accordance with each purpose, and thus the margin of memory operation voltage can be expanded.

(Characteristic 3)

In the dynamic flash memory according to the first embodiment of the present invention, since the PL-FET having a large variation of the threshold value between writing and erasing is positioned on the drain side of the WL-FET, change of the threshold voltage of the WL-FET due to current flow is extremely small and stable operation can be achieved. In a case of the opposite positional relation, the threshold value of the WL-FET has dependency on the resistance of a MOS channel region of the PL-FET and is unstable for reasons such as decrease of effective gate voltage due to floating of source voltage of the WL-FET, and increase of the threshold value due to a substrate biasing effect, and thus stable memory operation cannot be performed.

(Characteristic 4)

In the dynamic flash memory according to the first embodiment of the present invention, the threshold value of the MOS transistor region of the WL-FET can be set to be lower than the threshold value of a switching MOS transistor region of a typical memory, and thus current at "1" writing can be set to be large, which contributes to high-speed operation of the memory.

(Characteristic 5)

In the dynamic flash memory according to the first embodiment of the present invention, when the voltage of the plate line PL is set to voltage lower than the threshold value, contents in the memory are not affected by any change in the voltage of the bit line BL and the voltage of the word line WL in the same cell, and thus a structure that is extremely robust against a disturbance defect is obtained.

The present invention can have various embodiments and modifications without departing from the spirit and scope of the present invention in a broad sense. Each above-described embodiment is only intended to describe an example of the present invention and does not limit the scope of the present invention. Any above-described example and modification may be optionally combined. Some constituent components of the above-described embodiment may be omitted as necessary within the technological idea of the present invention.

INDUSTRIAL APPLICABILITY

With a semiconductor element according to the present invention, it is possible to provide a higher-density and higher-speed semiconductor memory device with a high operation margin as compared to conventional cases.

What is claimed is:

1. A memory device including a semiconductor element, the memory device comprising:
   a semiconductor base material extending in a direction horizontal to a substrate or standing in a direction vertical to the substrate;
   a first impurity region connected to one end of the semiconductor base material;
   a second impurity region connected to another end of the semiconductor base material on a side opposite to the first impurity region;
   a first gate insulating layer partially covering the semiconductor base material;
   a first gate conductor layer covering the first gate insulating layer;
   a second gate insulating layer partially covering the semiconductor base material; and
   a second gate conductor layer covering the second gate insulating layer without contacting the first gate conductor layer, wherein
   the semiconductor base material has a first region near the first gate conductor layer and has a second region near the second gate conductor layer, and
   a value of a fraction a numerator of which is average majority-carrier concentration of the second region of the semiconductor base material and a denominator of which is a value obtained by dividing a capacitance of a MOS gate structure constituted by the second gate conductor layer, the second gate insulating layer, and the semiconductor base material by an area of contact between the second gate conductor layer and the second gate insulating layer is different from a value of a fraction a numerator of which is average majority-carrier concentration of the first region of the semiconductor base material and a denominator of which is a value obtained by dividing a capacitance of a MOS gate structure constituted by the first gate conductor layer, the first gate insulating layer, and the semiconductor base material by an area of contact between the first gate conductor layer and the first gate insulating layer.

2. The memory device including a semiconductor element according to claim 1, wherein the majority-carrier concentration of the second region of the semiconductor base material is higher than the majority-carrier concentration of the first region of the semiconductor base material.

3. The memory device including a semiconductor element according to claim 1, wherein the value of a fraction the numerator of which is the majority-carrier concentration of the second region and the denominator of which is a value obtained by dividing the capacitance of the MOS gate structure constituted by the second gate conductor layer, the second gate insulating layer, and the semiconductor base material by the area of contact between the second gate conductor layer and the second gate insulating layer is larger than the value of a fraction the numerator of which is the majority-carrier concentration of the first region and the denominator of which is a value obtained by dividing the capacitance of the MOS gate structure constituted by the first gate conductor layer, the first gate insulating layer, and the semiconductor base material by the area of contact between the first gate conductor layer and the first gate insulating layer.

4. The memory device including a semiconductor element according to claim 1, wherein a total capacitance of the gate structure constituted by the second gate conductor layer, the second gate insulating layer, and the semiconductor base material is larger than a total capacitance of the gate structure constituted by the first gate conductor layer, the first gate insulating layer, and the semiconductor base material.

5. The memory device including a semiconductor element according to claim 1, wherein a thickness of the second gate insulating layer is larger than a thickness of the first gate insulating layer.

6. The memory device including a semiconductor element according to claim 1, wherein dependency of a threshold value of a MOS transistor region including the second gate insulating layer on majority-carrier concentration of the semiconductor base material is larger than dependency of a threshold value of a MOS transistor region including the first gate insulating layer on the majority-carrier concentration of the semiconductor base material.

7. The memory device including a semiconductor element according to claim 1, wherein voltage applied to a plate line connected to the second gate conductor layer when memory information is to be read is between a threshold value of a MOS transistor including the second gate conductor layer at memory writing and a threshold value of the MOS transistor at memory erasing.

8. The memory device including a semiconductor element according to claim 1, wherein variation of a threshold value of a MOS transistor region including the second gate insulating layer between memory written and erased states is larger than variation of a threshold value of a MOS transistor region including the first gate insulating layer between memory written and erased states.

9. The memory device including a semiconductor element according to claim 1, wherein an absolute value of a threshold value of a MOS transistor including the second gate insulating layer close to a bit line is constantly larger than an absolute value of a threshold value of a MOS transistor including the first gate insulating layer close to a source line.

10. The memory device including a semiconductor element according to claim 1, wherein memory write operation is executed by controlling voltage applied to each of the first impurity region, the second impurity region, the first gate conductor layer, and the second gate conductor layer to perform operation of generating electrons and holes in the semiconductor base material and the first impurity region through an impact ionization phenomenon with current flowing between the first impurity region and the second impurity region or through gate induced drain leakage current, and perform operation of retaining, in the semiconductor base material, some or all of either the generated electrons or holes that are majority carriers in the semiconductor base material, and memory erase operation is executed by controlling voltage applied to each of the first impurity region, the second impurity region, the first gate conductor layer, and the second gate conductor layer to remove either the retained electrons or holes that are majority carriers in the first semiconductor layer from at least one of the first impurity region and the second impurity region.

11. The memory device including a semiconductor element according to claim 10, wherein the first impurity region is connected to a source line, the second impurity region is connected to a bit line, the first gate conductor layer is connected to a word line, the second gate conductor layer is connected to a plate line, and memory writing and erasure are performed by applying voltage to each of the source line, the bit line, the plate line, and the word line.

12. The memory device including a semiconductor element according to claim 10, wherein the first impurity region is connected to the bit line, the second impurity region is connected to the source line, and memory writing and erasure are performed by applying voltage to each of the source line, the bit line, the plate line, and the word line.

* * * * *